United States Patent
Krishnamoorthy

(10) Patent No.: US 9,865,757 B2
(45) Date of Patent: Jan. 9, 2018

(54) METHOD FOR QUICK SELF INTERCONNECTION OF PHOTOVOLTAIC CELL ARRAYS AND PANELS

(71) Applicant: HELION CONCEPTS, INC., San Jose, CA (US)

(72) Inventor: Sudarshan Krishnamoorthy, San Jose, CA (US)

(73) Assignee: HELION CONCEPTS, INC., San Jose, CA (US)

(*) Notice: Subject to any disclaimer, the term of this patent is extended or adjusted under 35 U.S.C. 154(b) by 0 days.

(21) Appl. No.: 14/691,842

(22) Filed: Apr. 21, 2015

(65) Prior Publication Data
US 2015/0311371 A1    Oct. 29, 2015

Related U.S. Application Data

(60) Provisional application No. 61/983,098, filed on Apr. 23, 2014, provisional application No. 62/051,744, filed on Sep. 17, 2014.

(51) Int. Cl.
| | |
|---|---|
| *H02N 6/00* | (2006.01) |
| *H01L 31/042* | (2014.01) |
| *H01L 31/05* | (2014.01) |
| *H01L 31/02* | (2006.01) |
| *H02S 40/36* | (2014.01) |
| *H01R 24/28* | (2011.01) |
| *H01R 101/00* | (2006.01) |

(52) U.S. Cl.
CPC ...... *H01L 31/0504* (2013.01); *H01L 31/0201* (2013.01); *H01R 24/28* (2013.01); *H02S 40/36* (2014.12); *H01R 2101/00* (2013.01)

(58) Field of Classification Search
CPC .......... H02S 40/30; H02S 40/34; H02S 40/36; H02S 20/23; H02S 20/24; H02S 20/25
See application file for complete search history.

(56) References Cited

U.S. PATENT DOCUMENTS

| | | | |
|---|---|---|---|
| 4,582,953 A | * | 4/1986 | Nagase ............... F24J 2/0455 |
| | | | 136/251 |
| 7,285,719 B2 | | 10/2007 | Conger |
| 7,390,961 B2 | | 6/2008 | Aschenbrenner et al. |
| 7,804,022 B2 | | 9/2010 | De Ceuster |
| 8,016,007 B2 | | 9/2011 | Ashjaee et al. |
| 8,148,627 B2 | | 4/2012 | Rose et al. |

(Continued)

FOREIGN PATENT DOCUMENTS

JP    2007019140 A    1/2007

OTHER PUBLICATIONS

PCT Appl. No. US2015/027088, International Search Report dated Jul. 21, 2015.

*Primary Examiner* — Eli Mekhlin
(74) *Attorney, Agent, or Firm* — Seager, Tufte & Wickhem LLP

(57) ABSTRACT

Interconnectable solar photovoltaic appliance that can be connected to each other and other derivative products in multiple series and parallel configurations to supply a specific amount of electrical power to an application requiring electrical energy. The resultant design is modular and expandable. Examples include photovoltaic appliances that are variable in size in shape so as to accommodate the spatial constraints and power requirements of their intended applications.

20 Claims, 29 Drawing Sheets

(56) References Cited

U.S. PATENT DOCUMENTS

| | | |
|---|---|---|
| 8,684,752 B2 | 4/2014 | Hsueh |
| 8,821,178 B2 | 9/2014 | Fukui et al. |
| 2008/0149170 A1* | 6/2008 | Hanoka .................. H02S 40/34 136/251 |
| 2010/0154327 A1* | 6/2010 | Reyal ................ H01L 31/02008 52/173.3 |
| 2010/0275976 A1 | 11/2010 | Rubin et al. |
| 2011/0100436 A1* | 5/2011 | Cleereman ............. H01R 31/00 136/251 |
| 2011/0168230 A1 | 7/2011 | Buller et al. |
| 2011/0192448 A1 | 8/2011 | Croft et al. |
| 2011/0220180 A1 | 9/2011 | Cinnamon et al. |
| 2012/0006483 A1 | 1/2012 | Hanoka et al. |
| 2012/0013191 A1* | 1/2012 | Jeandeaud .............. H02S 40/34 307/80 |
| 2012/0073623 A1 | 3/2012 | Jones et al. |
| 2012/0085040 A1* | 4/2012 | Ketwitz, Jr. ............ H01L 31/05 52/173.3 |
| 2012/0181973 A1* | 7/2012 | Lyden .................. B60L 11/182 320/101 |

\* cited by examiner

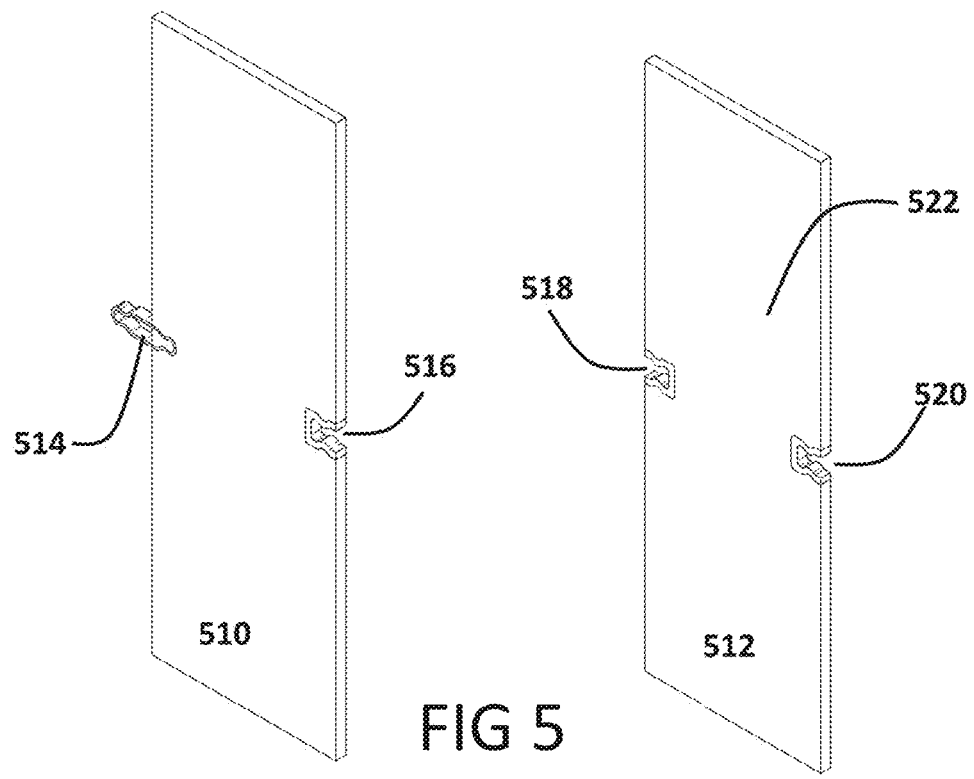

610

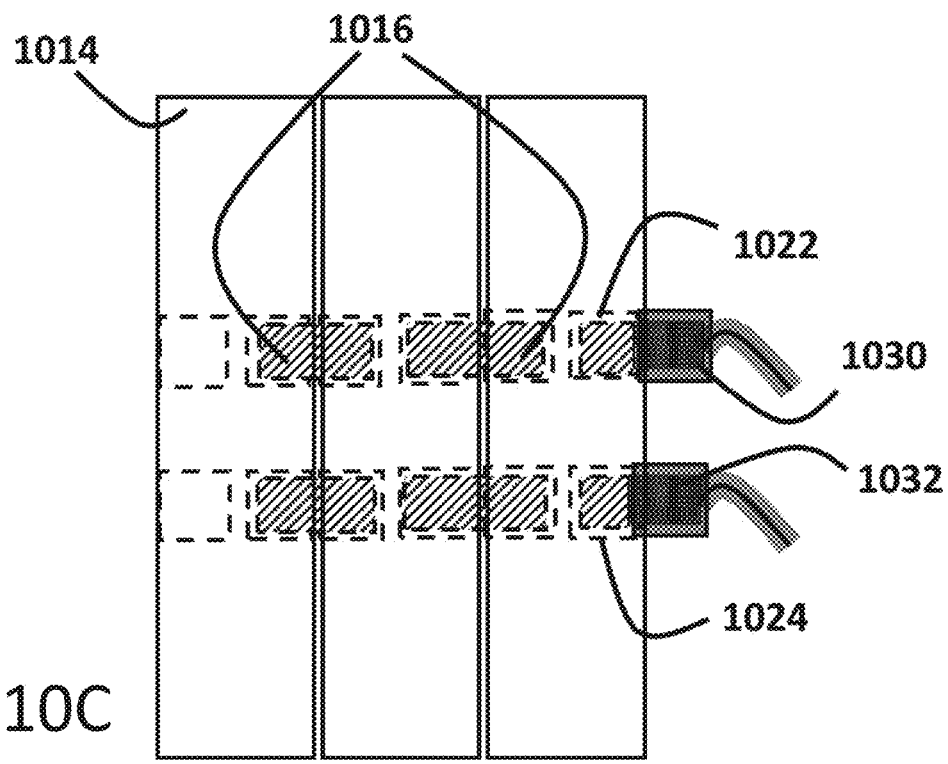

METHOD FOR QUICK SELF INTERCONNECTION OF PHOTOVOLTAIC CELL ARRAYS AND PANELS

CROSS REFERENCE TO RELATED PATENT APPLICATIONS

The present patent application claims the benefit of and priority to U.S. Provisional Patent Application No. 61/983,098, filed on Apr. 23, 2014, titled METHOD FOR QUICK SELF INTERCONNECTION OF PHOTOVOLTAIC CELL ARRAYS AND PANELS, the disclosure of which is incorporated herein by reference, and U.S. Provisional Patent Application No. 62/051,744, filed Sep. 17, 2014, titled METHOD OF INTERCONNECTION OF PRINTED CIRCUIT BOARDS USING ULTRA LOW PROFILE PCB EMBEDDABLE ELECTRICAL CONNECTOR ASSEMBLIES FOR POWER AND SIGNAL TRANSMISSION, the disclosure of which is also incorporated herein by reference.

TECHNICAL FIELD

The present invention relates to the field of solar photovoltaic cells, arrays, installations and electrical interconnections for high re-configurability, flexibility and customization to suit to various changing requirements as may be warranted.

BACKGROUND

Current photovoltaic modules and panels available in the market typically include a large number of photovoltaic (PV) cells soldered together using tabbing wire made of high conductivity metal like tin, copper or other metal alloy. The assembly is soldered together using a typical soldering material such as Tin or Tin-Lead alloy. The PV cells are connected in series or parallel configuration to form arrays and then encapsulated in polymer films sealed with glass top surface. The panels may or may not be enclosed in a metal frame depending on the backer material and the manufacturing process. The positive and negative terminating leads from strings of encapsulated solar PV cells are routed to a termination box attached to the panel. External wiring is used to manually string two or more such panels together in series or parallel to extract electrical power from the assembled panels. The output may be fed to an inverter or supplied to a battery bank for charging. These are the kind of panels one typically sees on rooftops and in commercial solar PV farms. The current state of art is static and precludes any reconfiguration of cell interconnections.

The PV panels described so far come in specific large dimensions and electrical power ratings. Such panels are manually connected to each other or an electrical device with electrical wire, usually by a certified electrical technician. If an application requires a non-standard form factor, or has a non-standard power requirement, the user has to solder PV cells together in series of parallel connections and protect the solar cells from atmospheric degradation with suitable encapsulation. Alternatives and enhancements to these static designs, as well as to system installations requiring skilled labor are desired.

Overview

The present invention in various illustrative embodiments provides a modular, readily connectable and therefore very flexible photovoltaic (PV) cell assembly. One object is to eliminate labor intensive, static and irreversible solder interconnections with dynamic, flexible and reversible spring enabled interconnections to adapt to multiple varying photovoltaic environments. Another object, for some embodiments, is to be able to monitor the health of individual photovoltaic modules for variations of temperature, power output, open circuit voltage and other typical solar cell characteristics. In an illustrative embodiment, devices and methods for interconnecting a photovoltaic appliance of one or more solar cells are presented. In an example, the solar PV cells are connected to a metal back-end interconnect structure and integrated termination connectors that facilitate quick and easy interconnection of the solar PV cells to achieve a desired voltage, current and power, without the need to solder solar PV cells together. The invention provides an easy way to rapidly interconnect solar PV cell in series or parallel connections to form customized PV panels or for other custom applications.

A first non-limiting example takes the form of a modular solar cell assembly comprising: a solar cell structure for receiving solar energy and converting the solar energy into electricity; an insulating layer; an interconnect layer; a backing layer; and a plurality of connectors each having a polarity, including a first connector of a positive polarity and a second connector of a negative polarity, which are connected to the solar cell structure by the interconnect layer such that, when the solar cell structure is irradiated with solar energy, the first connector receives a positive voltage relative to the second connector from the solar cell structure; wherein the plurality of connectors are configured for repeatable connection/disconnection to connectors on one or more adjacent modular solar cell assemblies of like design without soldering thereto.

A second non-limiting example takes the form of a modular solar cell assembly as in the first non-limiting example, wherein at least some of the plurality of connectors are male connectors having a protrusion extending beyond a border of the interconnect layer, and at least some of the plurality of connectors are female connectors configured to receive one or more male connectors of an adjacent modular solar cell assembly of like design. A third non-limiting example takes the form of a modular solar cell assembly as in the first non-limiting example, wherein the plurality of connectors are female connectors configured to receive and mechanically and electrically couple with a male coupler to facilitate connection to an adjacent modular solar cell assembly of like design.

A fourth non-limiting example takes the form of a modular solar cell system comprising at least two modular solar cell assemblies as in the third non-limiting example, and a plurality of male couplers for connecting together the at least two modular solar cell assemblies, wherein the plurality of the connectors of the at least two modular solar cell assemblies are configured and placed to facilitate each of: a parallel connection between the at least two modular solar cell assemblies; and a serial connection between the at least two modular solar cell assemblies. A fifth non-limiting example takes the form of a modular solar cell system comprising at least first, second, third and fourth modular solar cell assemblies as in the third non-limiting example, and a plurality of couplers for coupling together the at least first, second, third and fourth modular solar assemblies as follows: the first and second modular solar cell assemblies are coupled in parallel to one another in a first stage; the third and fourth modular solar cell assemblies are coupled in parallel to one another in a second stage; and the first stage and the second stage are connected together in series.

A sixth non-limiting example takes the form of modular solar cell assembly as in either of the second or third non-limiting examples, wherein the female connectors are constructed of a flexible and elastic metal for facilitating repeatable connection over a detent, a ridge or dimple of the male couplers. A seventh non-limiting example takes the form of a modular solar cell assembly as in any of claims the preceding non-limiting examples wherein the solar cell structure is a photovoltaic solar cell.

An eighth non-limiting example takes the form of a modular solar cell assembly as in any of the preceding non-limiting examples, having an outer perimeter in the shape of a polygon having at least one connector of positive polarity and at least one connector of negative polarity on each of at least two sides thereof. A ninth non-limiting example takes the form of a modular solar cell assembly as in any of the first to seventh non-limiting examples, having an outer perimeter in the shape of a polygon having at least one connector of positive polarity and at least one connector of negative polarity on each of at least three sides thereof. A tenth non-limiting example takes the form of a modular solar cell assembly as in either of the eighth or ninth non-limiting examples wherein each side has at least three connectors. An eleventh non-limiting example takes the form of a modular solar cell assembly as in any of the eighth to tenth non-limiting examples, wherein the polygon is a square or a rectangle.

A twelfth non-limiting example takes the form of a modular solar cell assembly as in any of the preceding non-limiting examples, further comprising at least one circuit element disposed in connection to the interconnect layer including one of an LED display, a diode, a resistor and a switch. A thirteenth non-limiting example takes the form of a modular solar cell assembly as in any of the preceding non-limiting examples further comprising an encapsulating layer covering at least the solar cell structure and weatherproofing at least a portion of the connectors.

A fourteenth non-limiting example takes the form of a modular solar cell assembly comprising: a solar cell structure for receiving solar energy and converting the solar energy into electricity; an insulating layer; an interconnect layer; a backing layer; at least first and second connectors configured, relative to the interconnect layer, to enable coupling of the modular solar cell assembly in series with one or more other modular solar cell assemblies; and at least third and fourth connectors configured, relative to the interconnect layer, to enable coupling of the modular solar cell assembly in parallel with one or more other modular solar cell assemblies. A fifteenth non-limiting example takes the form of a modular solar cell assembly as in the fourteenth non-limiting example, having a perimeter and a shape, the first and second connectors being located on opposite sides of one another on the perimeter, wherein the third and fourth connectors are located on the same side of the perimeter as the first connector, such that the first connector is located between the third and fourth connectors. A sixteenth non-limiting example takes the form of the fifteenth non-limiting example wherein the shape is a quadrilateral and the perimeter includes three connectors on at least three sides thereof.

A seventeenth non-limiting example takes the form of a method of constructing a solar cell array comprising connecting together at least two modular solar cell assemblies as in any of the preceding non-limiting examples. An eighteenth example takes the form of a method as in the seventeenth non-limiting example, wherein at least two of the at least two modular solar cell assemblies are connected in series with one another. A nineteenth non-limiting example takes the form of a method as in the seventeenth non-limiting example wherein at least two of the at least two modular solar cell assemblies are connected parallel to one another. A twentieth non-limiting example takes the form of a method as in any of the seventeenth to nineteenth non-limiting examples wherein the step of connecting is performed without applying adhesive or soldering.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

FIG. 5 shows two configurations of the metal interconnect layer with electrical connectors;

FIGS. 10A-10C shows a metal interconnect layer configuration that enables two photovoltaic appliances to be connected in parallel;

Figure 1A:
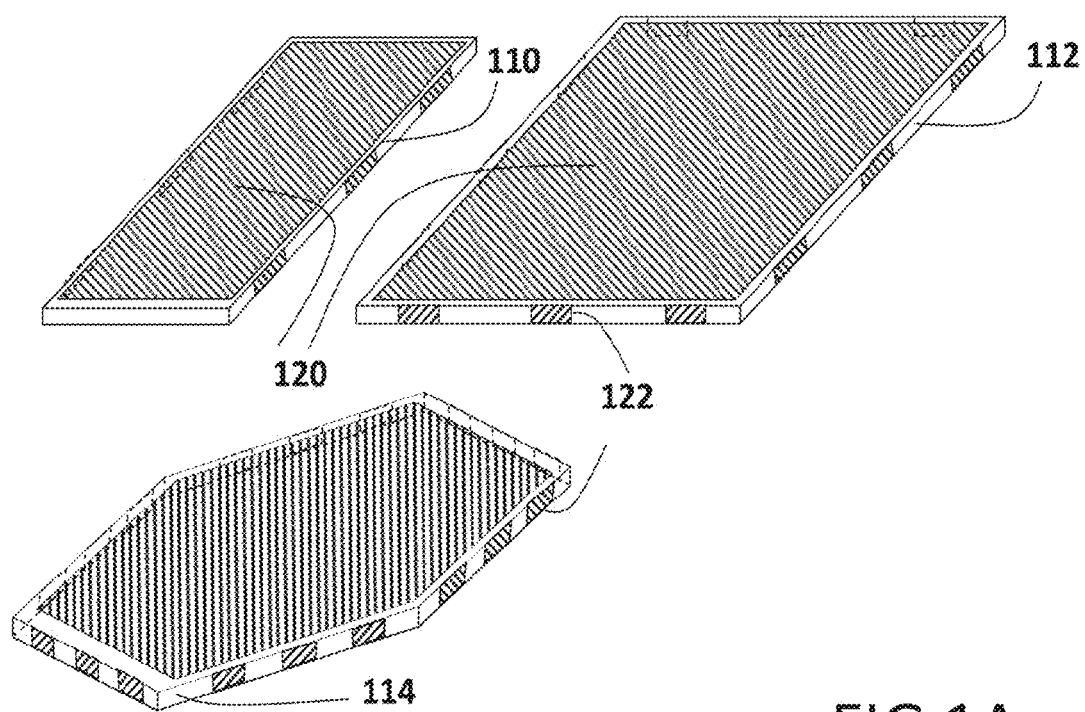
FIGS. 1A-1B show several photovoltaic appliances with different shapes and form factors.

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED SPECIFICATION

Most solar cells readily available in the market today can be cut to any shape and size using laser cutters and diamond saws. The concept of the modular photovoltaic (PV) appliance in the present invention includes connecting and encapsulating PV cells using a back-end metallization that facilitates highly flexible field use. A PV appliance of the present invention is modular in that a number of smaller PV appliances can be readily assembled together to make an installation in widely varying fashions, from large areas, to small areas, for high voltages or low voltages, using parallel or series interconnections. Moreover, the shape of the installation is not constrained; as there is no requirement that a single regular shape be the resulting installation. Finally, installations made up of several PV appliances, in the present invention, can be field assembled in a modular manner without a high degree of skill and without soldering. Some embodiments are highly configurable for use in parallel and series configurations (and combinations thereof), while other embodiments may be simpler in design while still facilitating multiple modular appliances to be connected together.

Figure 1B:
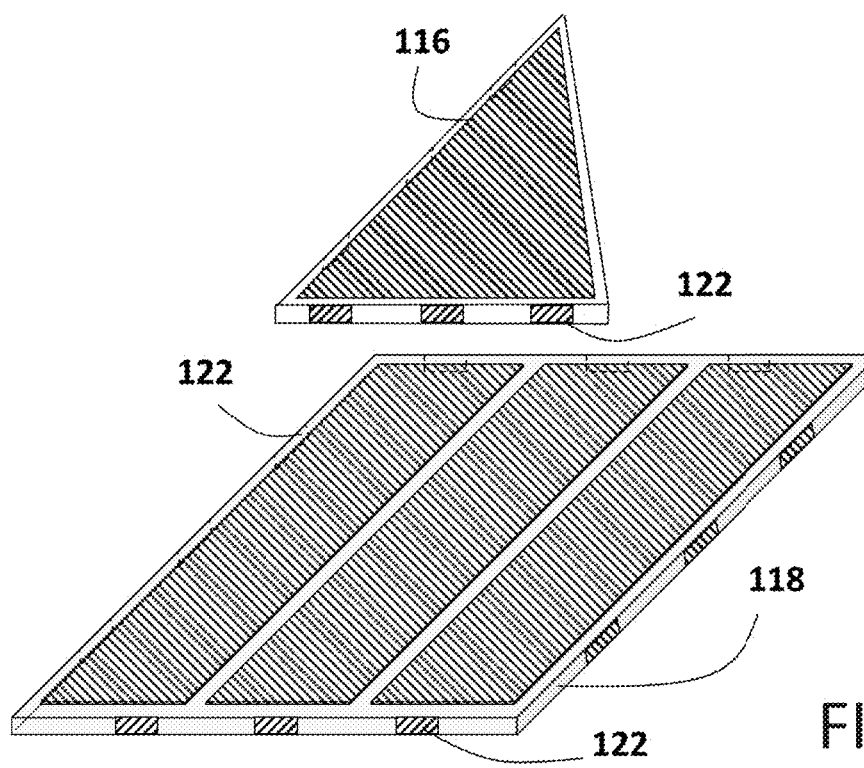

Several form factors are shown in FIGS. 1A-1B. Depending on the needs of the end application and the spatial constraints, the PV appliance can be formed in any arbitrary shape like the rectangle 110, square 112, and hexagon 114 as shown in FIG. 1A, or in a triangle as shown at 116 in FIG. 1B. A single PV appliance may contain more than one solar cell connected in series or parallel to achieve a specific unit configuration of the PV appliance, as shown at 118. A unit configuration means any particular and repeatable specific set of voltage, current and power values for a PV appliance.

In one embodiment each PV appliance comprises one or more solar cells 120 connected to a back-end end metal interconnect that terminates in multiple appliance connectors 122. Greater or fewer numbers of connectors 122 than those shown may be included. The back-end metal interconnect layer and the connectors are described in detail below.

An illustrative example for the photovoltaic appliance is a rectangle or square (or other shape as shown in FIGS. 1A-1B) with a unit electrical configuration of 0.55 volts and 1.4-8.4 Ampere of current at maximum power for a monocrystalline silicon solar cell depending on the size of the solar cell. The current generation capacity of the solar cell is directly proportional to the surface area of the solar cell exposed to light. The aforementioned electrical configuration is based on illumination conditions with intensity of 1000 W/m2, spectrum of AM1.5 global and temperature of 25° C. Other sizes may be used and different electrical characteristics may be incorporated based on size and chemistry of the solar cell in each PV appliance. The particular chemistry of the cell may be not limited to monocrystalline silicon, and may include any suitable monocrystalline, polycrystalline and thin films solar cells and may be adapted to other solar cell technologies as they become available. Coupling such units in series can allow for higher voltages, while placing such units, or series of such units, in parallel can facilitate higher current throughput.

Figure 2:
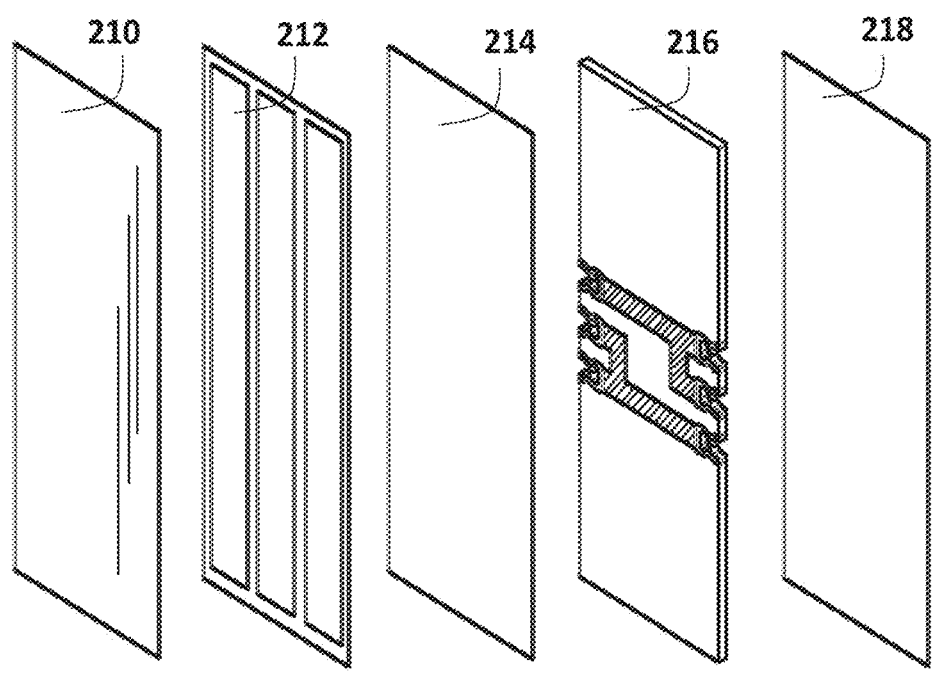
FIG. 2 is an exploded view of an illustrative photovoltaic appliance, showing the various layers thereof.

An exploded view of the photovoltaic appliance shows a modular solar cell assembly composed of five layers as shown in FIG. 2. The top layer is a generally transparent layer (at least to the relevant wavelengths of light) 210 which can be an encapsulant material such as ethylene vinyl acetate (EVA) and/or any durable fluoropolymer, glass or acrylic sheet which allows efficient transmission of light. The next layer is the solar cell 212 which converts sunlight to electricity. Layer 212 may include plural solar cells in series or parallel. The solar cells are electrically connected to a metal interconnect layer 216, typically with a tin or silver coated tabbing wire, and the whole assembly rests on an appropriate backsheet 218 which can be made of any commonly available material like plastic, synthetic polymer or wood.

The metal interconnect layer 216 comprises of electrical wires routed in a specific configuration and terminated into the appliance connector 122. This routing of electrical wires in the metal interconnect layer can be done with tin/silver coated tabbing wires glued or held on top of an insulating substrate. In some examples, the metal interconnect layer may include copper (or other conductive material) traces on a printed circuit board or flexible circuit. For example, a 2 or 3 layer circuit board may be used. This metal interconnect layer is described in detail below. While metal interconnects are described, any suitable conductive material (such as a conductive polymer) could be used to facilitate current flow out of the photovoltaic cells.$_{[m1]}$ The insulation layer 214 that separates the solar cell from the back-end metal interconnect layer can be made of substances like paper, plastic or any other natural or synthetic polymer with good electrically insulating properties. The back-end metal interconnect structure can also add support to the fragile solar cells.

The connection between the solar cell layer 212 and the interconnect layer 216 may be made by connecting the positive and the negative contacts of the solar cell to the appropriate location of the interconnect. This may be accomplished with a feedthrough design directly through layer 214, or by including wiring running around the perimeter of the insulating layer 214. In several embodiments, the interconnect layer terminates into a special electrical connector designed to enable proper connection of individual photovoltaic appliance in multiple voltage and current configurations by simple insertion of male and female electrical contacts. The metal used in this the electrical connectors may have reasonable elasticity and springiness to accommodate repeated coupling and decoupling of the contacts.

The connectors may be general purpose male to female connectors currently available in the market. In some examples, the connectors, and the slots used therewith, may have special form factor and designs such as a spring cantilever clip for use with a ripple or a dimple as proposed several embodiments below. Some additional discussion of such interconnects appears in U.S. Provisional Patent Application 62/051,744. It is desirable in several embodiments that the connectors work in a manner that allows interconnection of PV appliances without applying adhesive or soldering.

The whole assembly can be encapsulated in an encapsulant such as EVA and/or fluoropolymer for making the modular solar cell assembly weatherproof giving final products as shown in FIGS. 1A-1B. The whole assembly can also be encased within a plastic body or a sturdy casing and sealed with epoxy to form a rigid structure. The PV appliances shown herein can accommodate monocrystalline, polycrystalline and thin films solar cells and may be adapted to other solar cell technologies as they become available. In several examples at least two, or at least three, or all sides of a given PV appliance include one or a plurality of connectors. For example, some designs will have four sides, three of which will include connectors. In some other examples, shown below, all sides, such as all four sides of a four sided quadrilateral will have a plurality of connectors thereon.

The electrical appliance connectors 122 may be made of a metal with low resistivity, such as Copper and its alloys, or any other electrically conductive and elastic material. The elasticity of copper alloys such as phosphorus copper and beryllium copper can facilitate durable designs allows multiple insertions of the male and female contacts for establishing electrical connection. The electrical appliance can take multitude of electrical connection systems in the market like the pin type connection systems seen on circuit boards and PCBs and magnetic connectors that can been seen in many laptop and tablet power connectors. However, some embodiments highlighted herein include flat connectors designed to approximate the flat profile of the photovoltaic appliances themselves. In addition, the flexibility of the flat connector pins shown below lend themselves to more versatility in formation of various electrical connections as will be seen below. This kind of electrical connection system also lends itself to ease in manufacturing. A specific embodiment for a flat clip type connector is described below.

Figure 3:
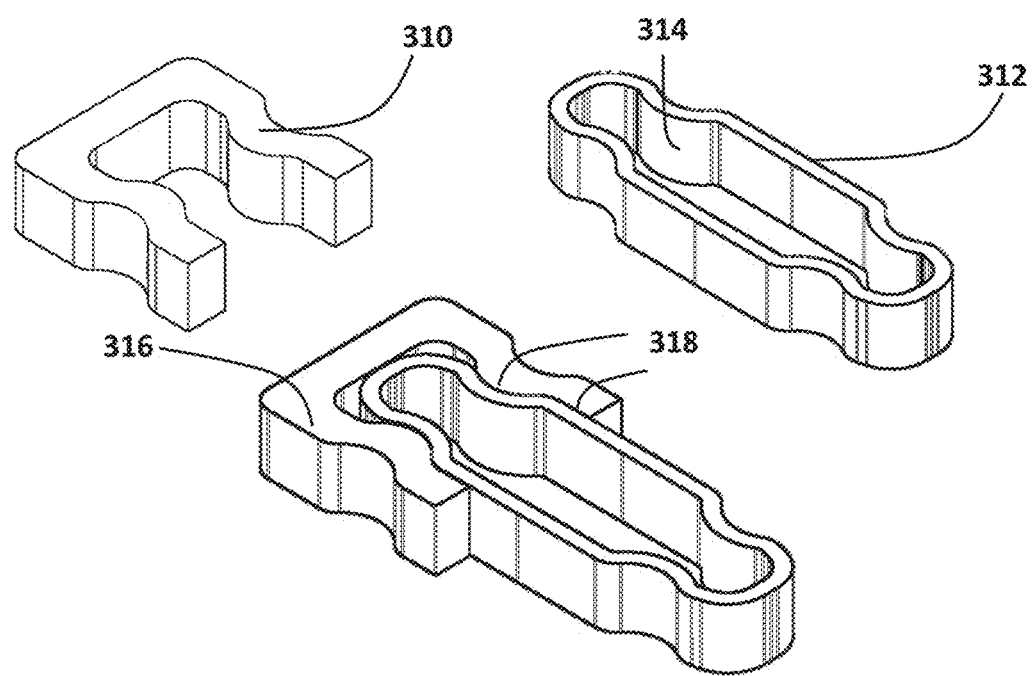
FIG. 3 shows one of the embodiments of the appliance electrical connectors as a flat elastic metal connector.

As shown in FIG. 3 a female contact 310 can be formed by folding a sheet of material by hammering or bending and annealing it into a clip-like formation. The male contact 312 may be a straight sheet metal strip made of a similar metal with a dimple, detent, ridge or protrusion 314 towards the end to make a firm electrical connection 316 with a large area of contact 318 with the female connector. The dimple 314 mates with the shape of the female contact 310 for secure connection. In some examples, the dimple 314 and shape of the female contact 310 are configured to provide an audible click and a tactile feedback to the person connecting the photovoltaic appliances.

Figure 4A:
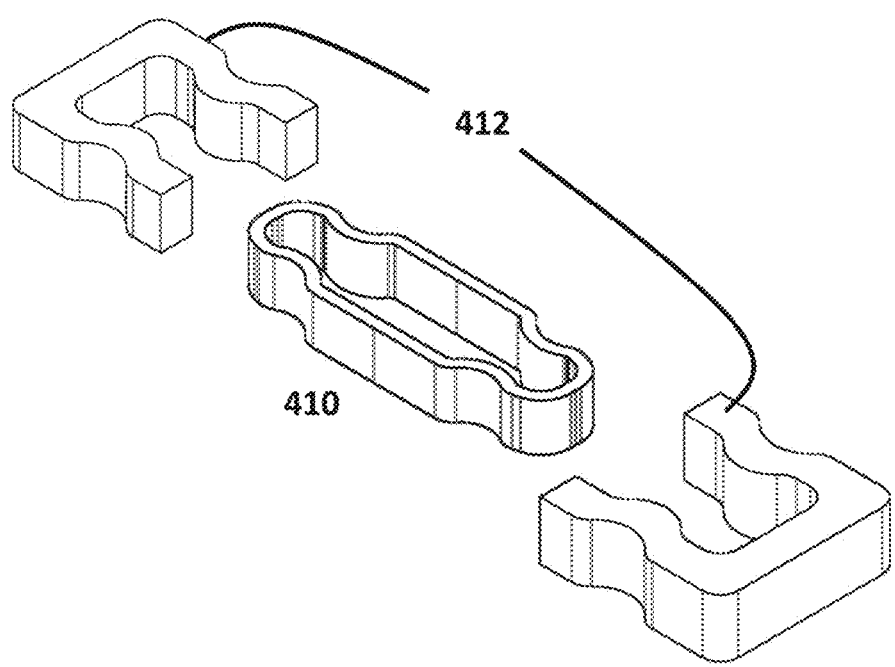
FIGS. 4A-4B show a flat elastic metal connector and the coupling mechanism for an illustrative embodiment.
Figure 4B:
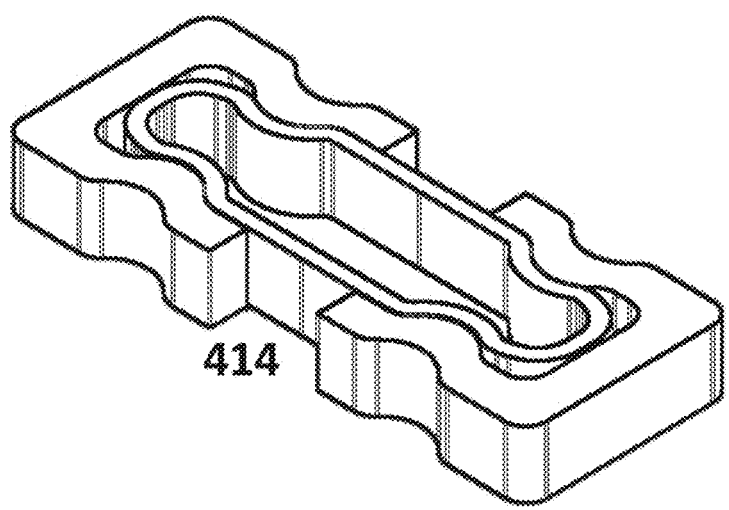

In another embodiment shown in FIG. 4A, a male coupling connector or coupler 410 with dimples or protrusions on both ends can be used to connect two female connectors 412 as shown in FIG. 4B. This example may again take the form of a flat clip type appliance connector configured to fit within the thickness of the PV appliances shown herein. In an illustrative example, this configuration allows for all the connectors in the photovoltaic appliance to be female connectors. As used herein, the connectors are the male or female pieces on the PV appliance, and a coupler is a device which is used to couple together, electrically and mechanically, two connectors on separate PV appliances. An appliance connector is a piece which is used to extract electrical energy from a PV appliance or assembly of multiple PV appliances.

Figure 6A:
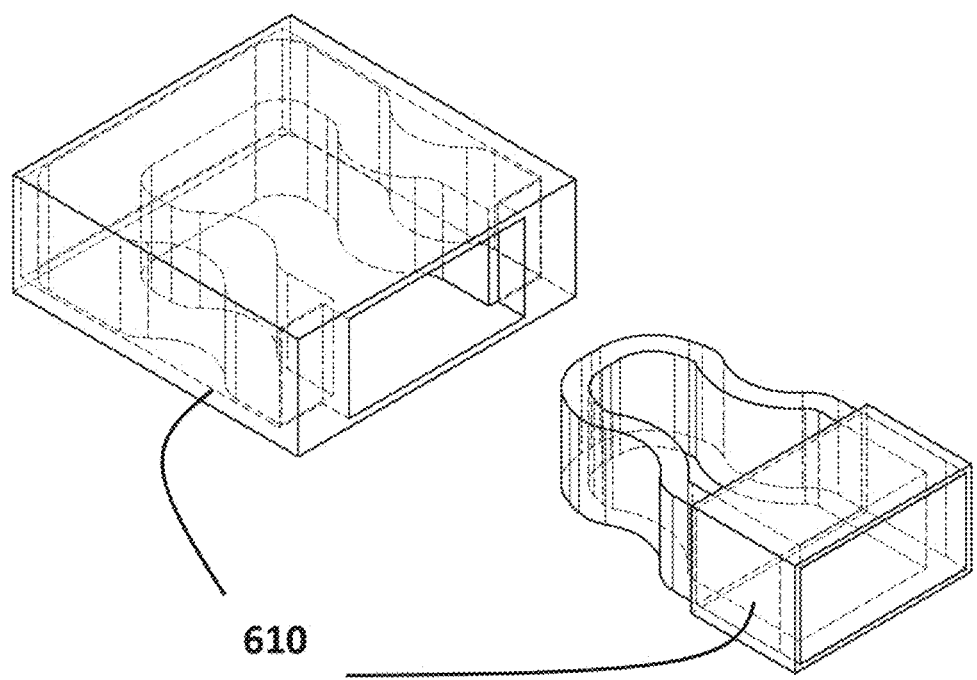
FIGS. 6A-6B show a flat elastic metal connector with weatherproof sheathing.
Figure 6B:
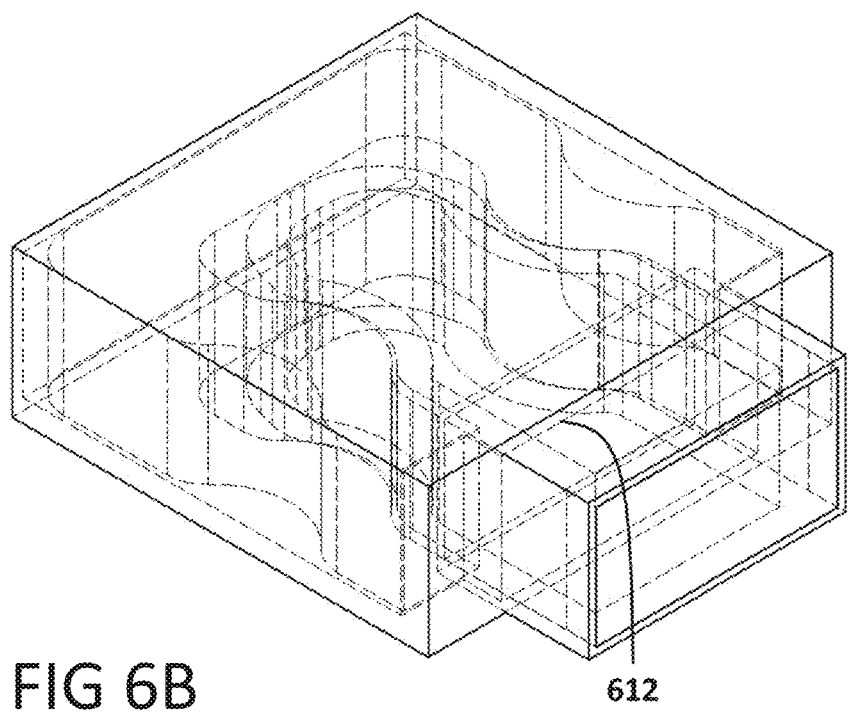

Thus referring to FIG. 5, two configurations can be made available. First, at 510, a device has a male connector side 514 and a female connector side 516. Second, at 512, however, the male connector side 514 can be replaced by a female connector side 518, such that only female connectors are provided. This approach at 512 may be easier to manufacture and package, as there are no protruding parts. The user may unpackage and handle the modular PV appliance 512 without worrying that a fragile male connector 514 will be damaged. Generally speaking, the embodiment at 510 may be made available, but it is expected that the embodiment at 512 would be more commonly used.$_{[m2]}$ In another embodiment of the flat clip type appliance connector shown in FIG. 6A, the female or male connectors can be enclosed in rigid enclosures or flexible sheathing 610 to make the connections between male and female contact waterproof and weatherproof as might be needed for some outdoor applications. The enclosure or sheathing 610 may be formed with similar materials as the encapsulant—that is, EVA or a fluoropolymer may be used, for example, though any weatherproof material may be used as there is no need for the material to be transparent. The sheathing on each of the male/female connectors may be configured to mate when the electrical connection is made as shown at 612 in FIG. 6B. Such sheathing or encapsulant may be used on connectors for each PV appliance, and may be used on the appliance connectors for extracting power from a PV appliance. It may also be used on couplers between two PV appliances, if desired.

Figure 7:
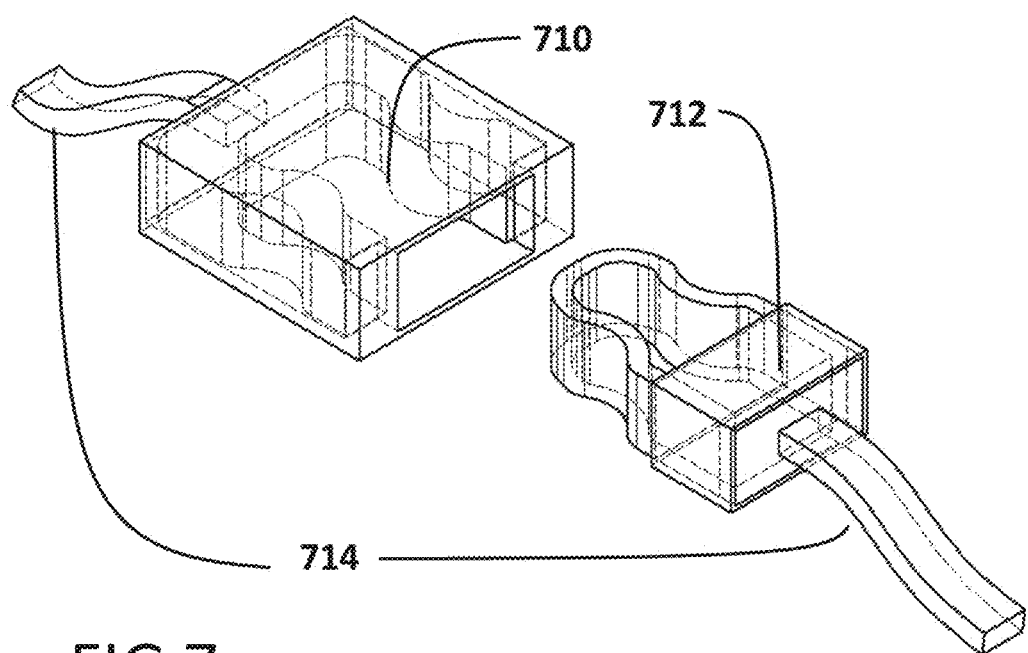
FIG. 7 shows an example of a flat elastic metal connector connected to electrical wires that can act as end termination plugs.

In an embodiment of the appliance connector shown in FIG. 7 the female 710 and male 712 connectors shown can be connected to electrical wires 714 (for example by soldering, brazing, or crimping) to form end termination plugs. This can be used to extract the electrical power from a photovoltaic appliance or an array of photovoltaic appliances connected to each other, which can be supplied to an external load. For example, the male appliance connector 712 can be used for any of the connectors of an all-female design 512 (FIG. 5), while in other examples both male and female appliance connectors 710, 712 may be provide for a design having both male and female connectors 510 (FIG. 5).

Figure 8:
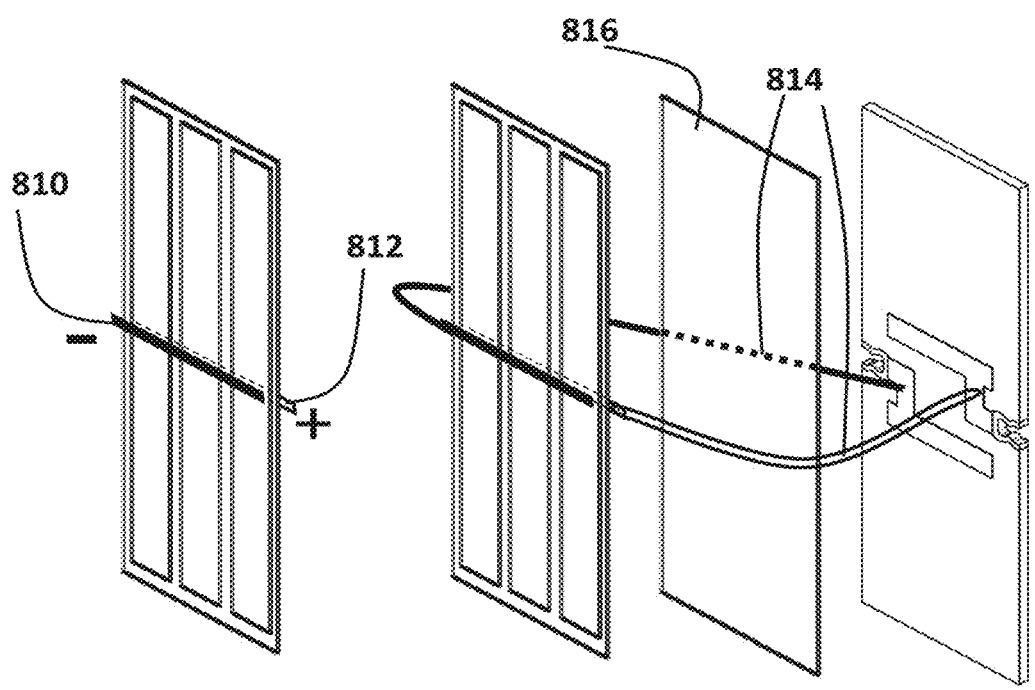
FIG. 8 shows the connection of the metal interconnect layer to the solar photovoltaic cell.

The purpose of the metal interconnect layer is to provide an electrical path for connecting a PV appliance to one or more other PV appliances to achieve one or both of serial and parallel connection, and to the appliance connectors for extracting power from a completed assembly with two or more PV appliances so as to increase the total power output of the assembly. Metal interconnect layers may be assembled using insulated wires laid out in a desired configuration, or may be formed using printed circuit board and/or flexible circuit technologies. Referring again to FIG. 5, in a rather simple embodiment of the metal interconnection layer, the connectors 518 and 520 of PV appliance 512 in are to be electrically connected to the solar cell with one as anode and the other as cathode. FIG. 8 shows the contacts on the front side of a solar cells 810, which are typically negative in polarity (anode, with current flowing in), and the back side of the solar cell with tabbed contacts, which is typically positive in polarity 812. Connection to the metal interconnect layer 814 can be accomplished with a feedthrough design—such as a throughole, or may include routing a wire around the perimeter of the solar cells 810. The connections shown in FIG. 8 imply that the left side female connector and the right side female metal connector are connected to the negative and positive terminals of the solar cells respectively. These polarities can be easily reversed by reversing the connections. The electrical connections may be accomplished using tin, lead or silver based solder using heat to melt the solder or with the help of electrically conductive glue. The metal interconnect layer and the solar cell may be separated using an insulating layer 816 such as an electrical tape, insulating paper, or a thin polymer layer which can be laminated to the back side of the solar cell layer 810 or on top of the interconnect layer 814.

Figure 9A:
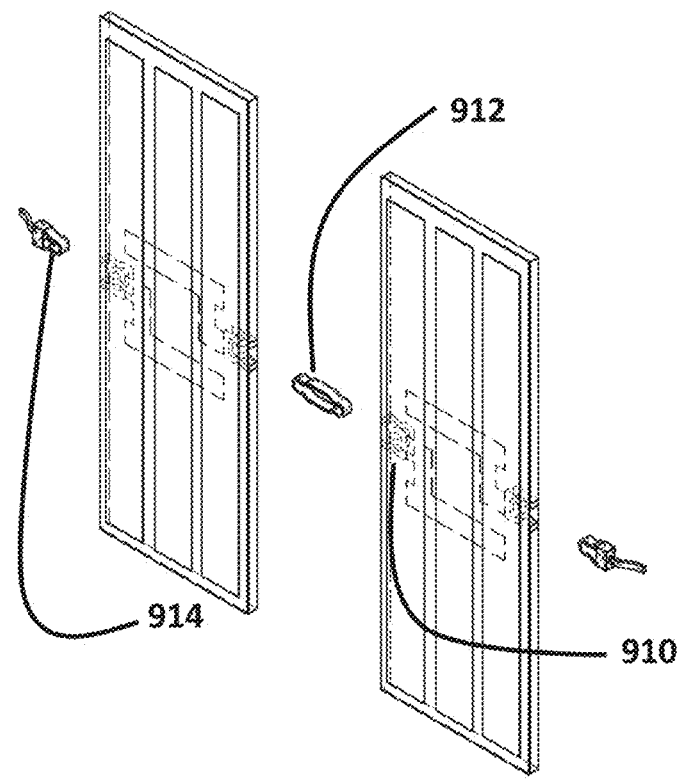
FIGS. 9A-9D show illustrative modular systems having male/female and female-only interconnections.
Figure 9B:
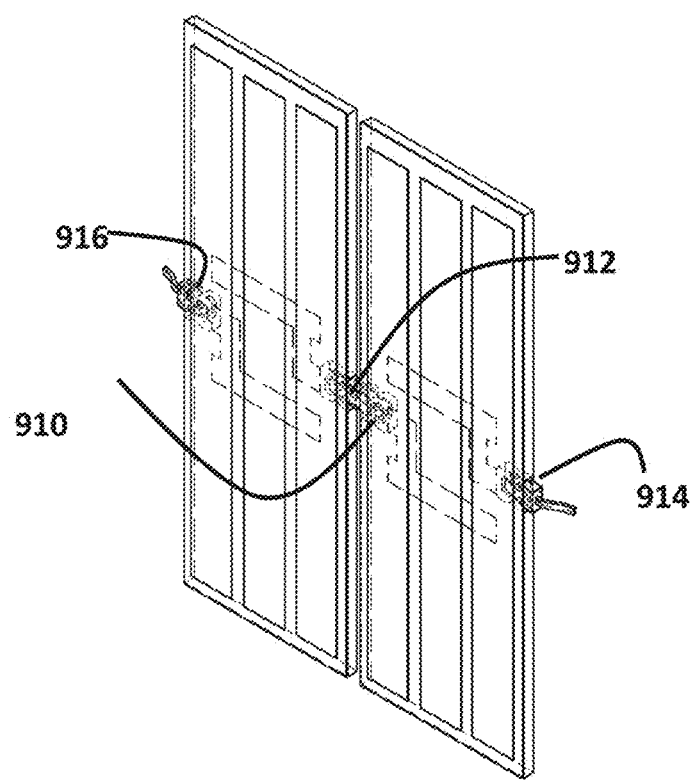

FIGS. 9A-9B show a series coupling of two PV appliances. A connection for a series figuration can be completed by inserting a male coupler 912 shown in FIG. 9A into two adjacent female connectors 910 opposing in polarity, that is, the positive terminal of one PV appliance is connected to the negative terminal of the adjacent PV appliance. Any number of PV appliances can then be connected in series to form an array and achieve a desired configuration. Appliance connectors 914 can be used to connect the array to eternal applications that need electrical power. As shown in FIG. 9B, two PV appliances are connected in series by the male coupler 912, and appliance connectors 914, 916 are used to extract electrical power from the completed assembly.

Figure 9C:
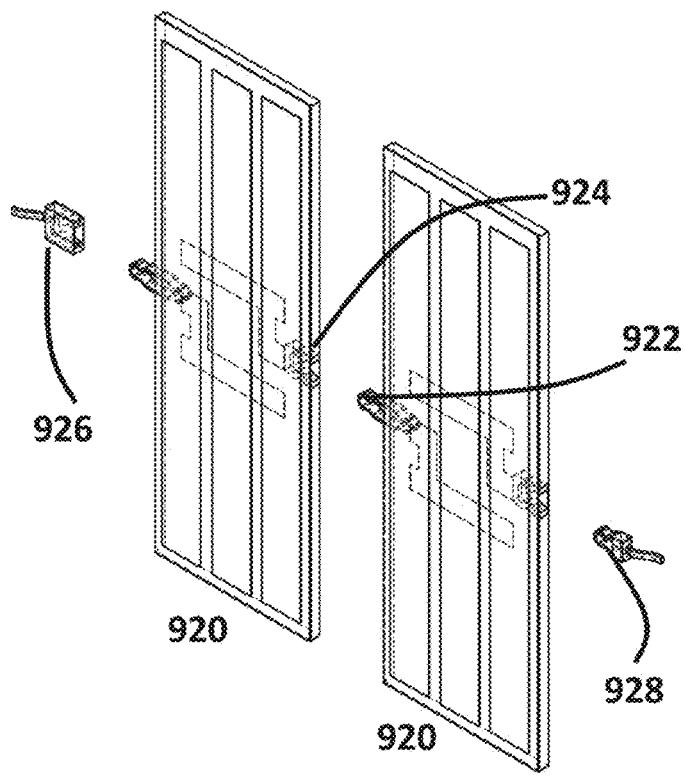

FIG. 9C illustrates an example in which two PV appliances 920 each have at least one male connector 922 and one female connector 924, with a female appliance connector 926 and male appliance connector 928 for extracting power.

Figure 9D:
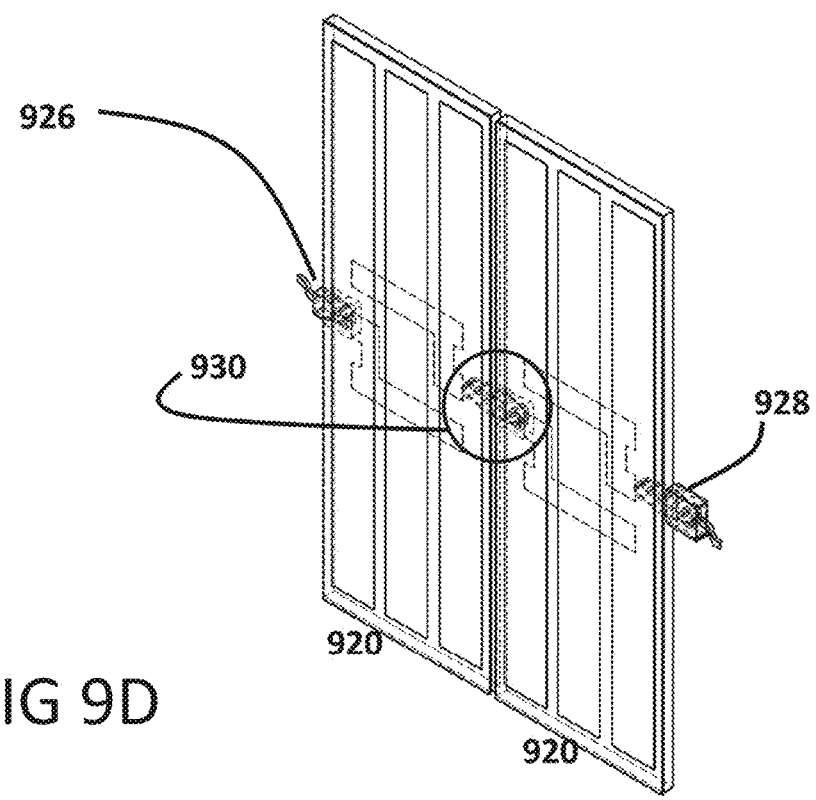

The completed assembly as shown in FIG. 9D includes the coupled connectors at 930 between the appliances 920, and appliance connectors 926, 928.

Figure 10A:
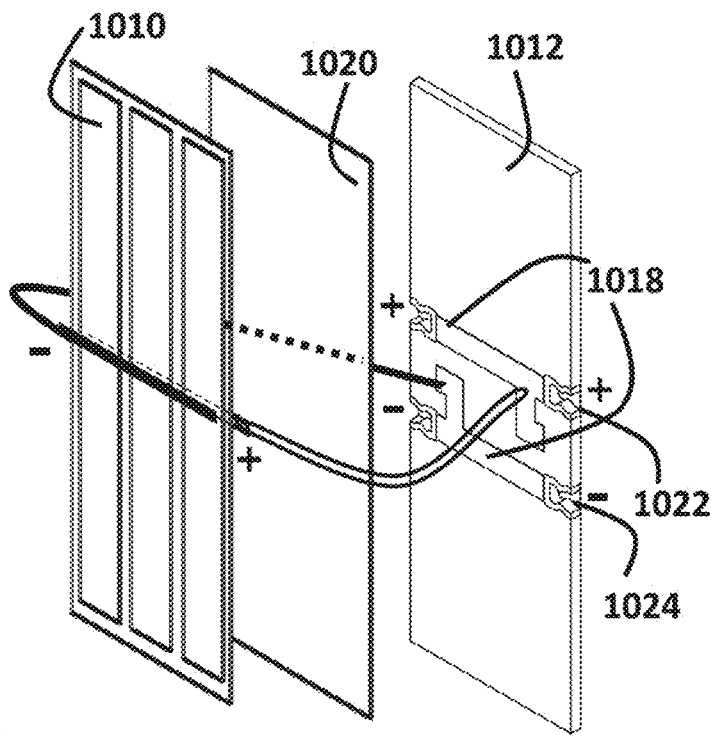

Another set of embodiments include PV appliances with a metal interconnect layer that enables parallel connection of two or more PV appliances to increase the current available, while keeping the voltage constant. This variation is shown in FIG. 10A, which shows an exploded view highlighting the particular design of the interconnect layer 1012, which is again separated from the solar cell layer 1010 by an insulator layer 1020. Traces or wires 1018 connect to positive terminals 1022 and negative terminals 1024 on each edge of the PV appliance interconnect layer 1012. Based on the connection of the solar cell it is apparent that the top left and top right female connectors are of positive polarity and are thus positive terminals 1022, and bottom left and right connectors are of negative polarity and are thus negative terminals 1024. Again this specific polarity could easily be interchanged by reversing the wires connecting the metal interconnects to the solar cell.

Figure 10B:
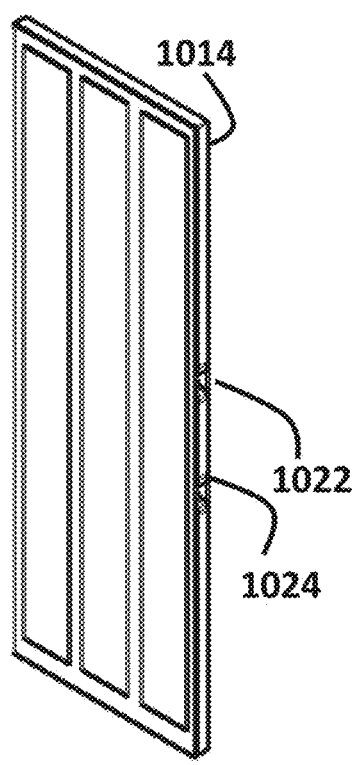

FIG. 10B shows the appliance 1014, with positive terminal 1022 and negative terminal 1024. The interconnection between two PV appliances 1014 is enabled with the male coupler 1016 connecting the two female connectors of like polarity, placing each in parallel in the completed connection shown in FIG. 10C. This configuration sums the current produced by each PV appliance keeping the voltage constant. For example, as shown by FIG. 10C, three PV appliances 1014 are connected together in parallel by the couplers 1016, such that the outputs obtained with appliance connectors 1030, 1032 would be capable of a voltage V and current throughput 3 I, where V is the voltage and I is the current for a single PV appliance 1014.

Figure 11A:
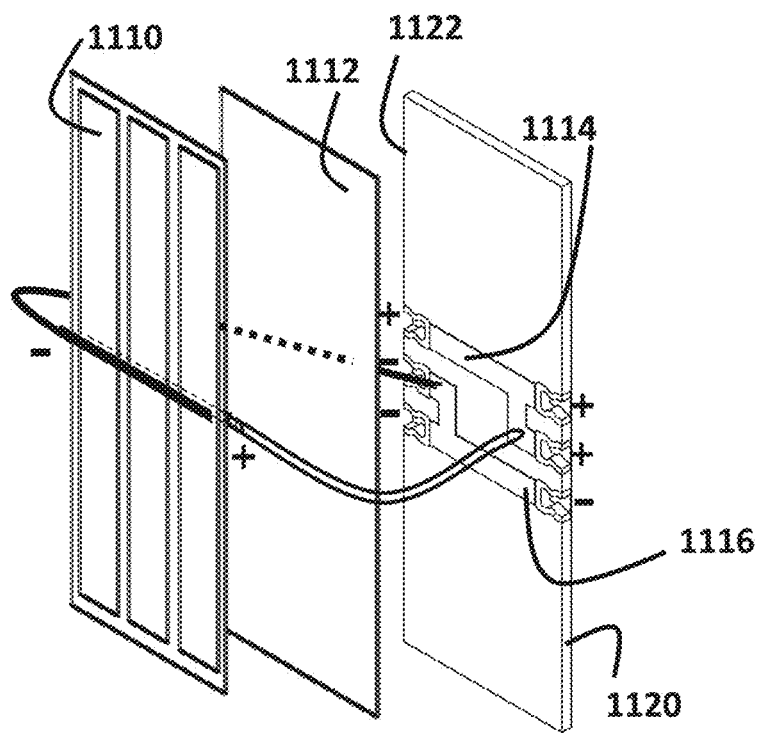
FIGS. 11A-11D show an illustrative modular system having series and parallel connection configurations available.
Figure 11B:
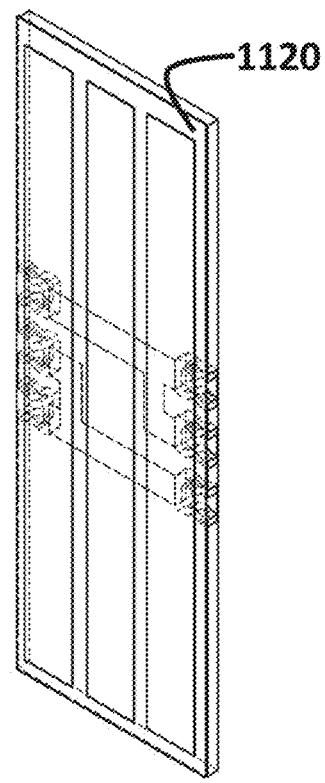

FIG. 11A builds on the design of FIGS. 10A-10C by enabling both parallel and series connections. As shown on the interconnection layer 1114 of FIG. 11A, there are two positive terminals and one negative terminal on a first edge 1120, and two negative terminals and one positive terminal on a second edge 1122. This polarity configuration can be changed by interchanging the wire connections to the solar cell. As before an insulating layer 1112 separates the interconnect layer 1122 from the solar cell layer 1110. In this example, connecting the central positive to the negative connectors of the PV appliances connects the appliances in series, while connecting the top and bottom female connectors 1118 will connect PV appliances in parallel. FIG. 11B is a perspective view of the PV appliance, with three female connectors on each side.

Figure 11C:
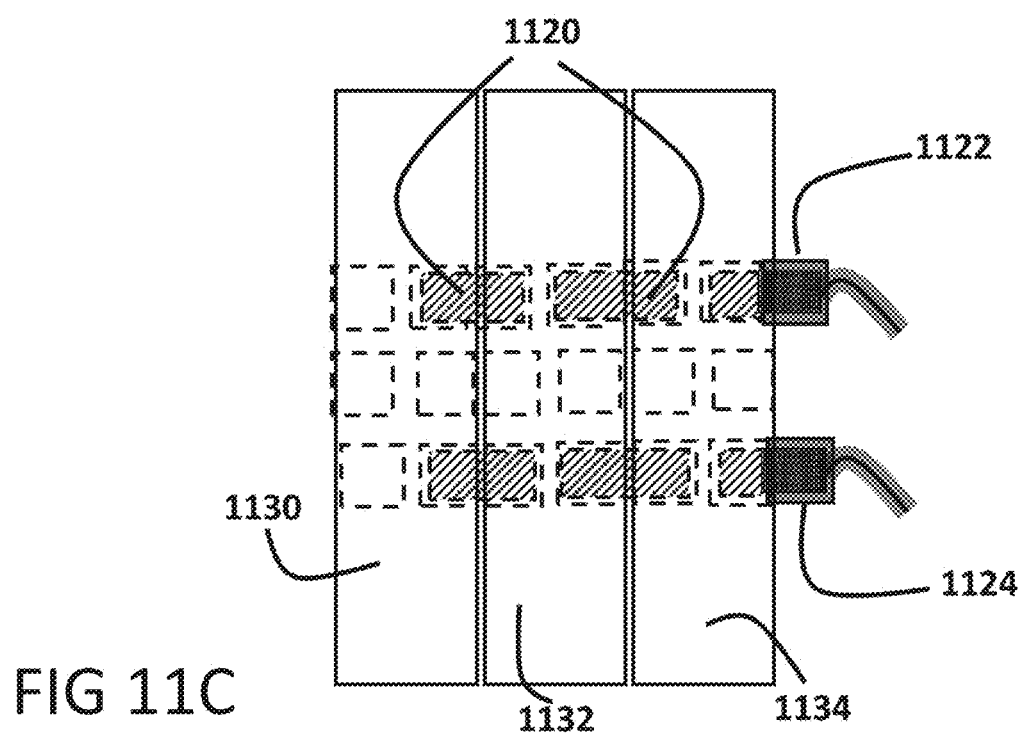
Figure 11D:
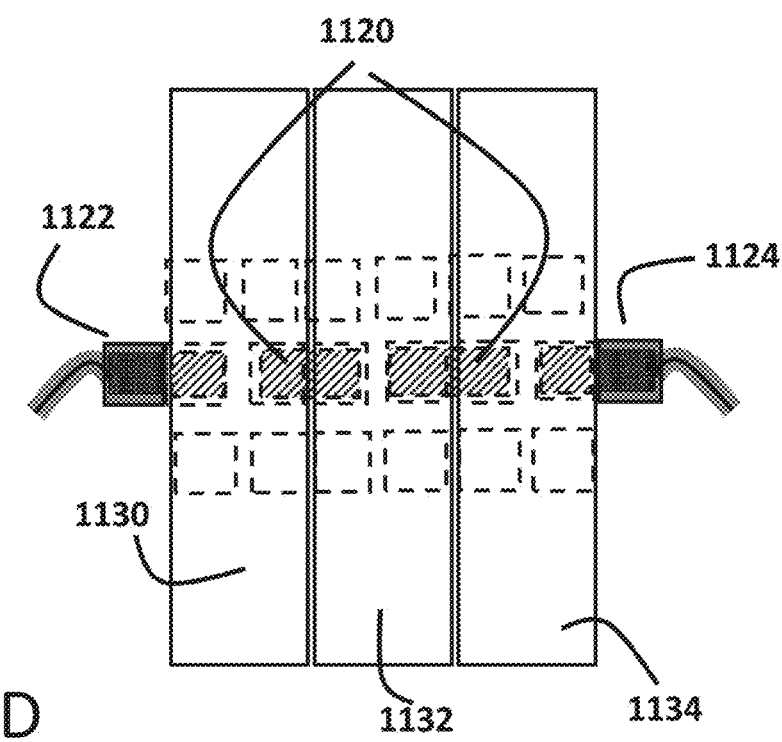

If V is the voltage output, and I is the current throughput, of one PV appliance 1120, the design of FIG. 11A-11B can be readily adapted for use in parallel and series without changing the footprint of the overall assembly. FIG. 11C shows a parallel configuration, and FIG. 11D shows a series configuration, each obtained using appropriate connection of male couplers 1120 and the appliance connectors 1122, 1124. In FIG. 11C, the appliance connectors 1122 and 1124 would obtain an output voltage of 1V, with current capacity of 3 I from parallel connected PV appliances 1130, 1132, 1134. Using the same footprint, as shown in FIG. 11D, couplers 1120 are used to connect together three PV appliances 1130, 1132, 1134 in a series configuration to obtain an output voltage of 3V and current of 1 I.

Figure 12:
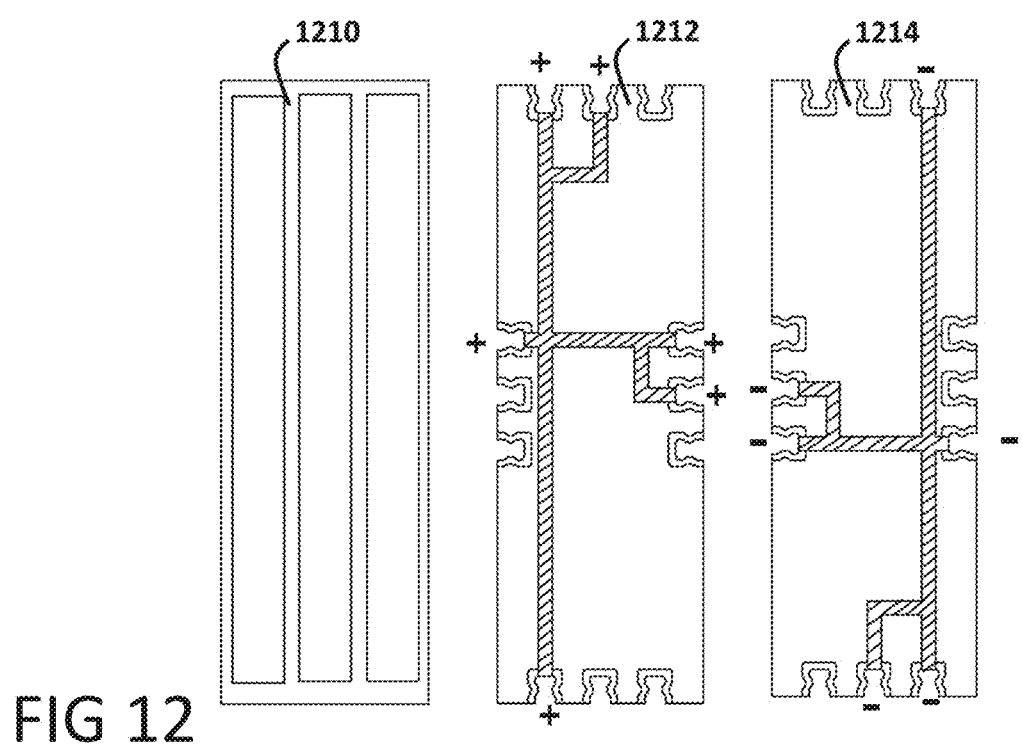
FIG. 12 shows an exploded view of a modular device as illustrated in FIG. 13 highlighting conductive layers therein.

FIG. 12 illustrates how a two-layer interconnect structure may be made for use in further examples shown in FIGS. 13A-13D. The solar cell layer 1210 overlies a two layer printed circuit board (with insulation layers omitted for simplicity), in which one layer 1212 is the "positive connection" layer and has terminals on all four edges of a rectangular PV appliance, with two positive terminals on each of two sides, and a single positive terminal on the remaining two sides. Another layer 1214 is the "negative connection" layer having, again, terminals on all four sides, with two negative terminals on each of two sides and two positive terminals on the remaining two sides. It should be noted that for user convenience, the terminals may be color coded for positive and negative terminals. For example, using a common approach, the negative terminals may be black, while the positive terminals may be red. Alternatively, a marking may be provided on the face or edge of the PV appliance. In another example, each PV appliance may be marked with a unique number or code to facilitate layout and troubleshooting for larger installations.

Figure 13A:
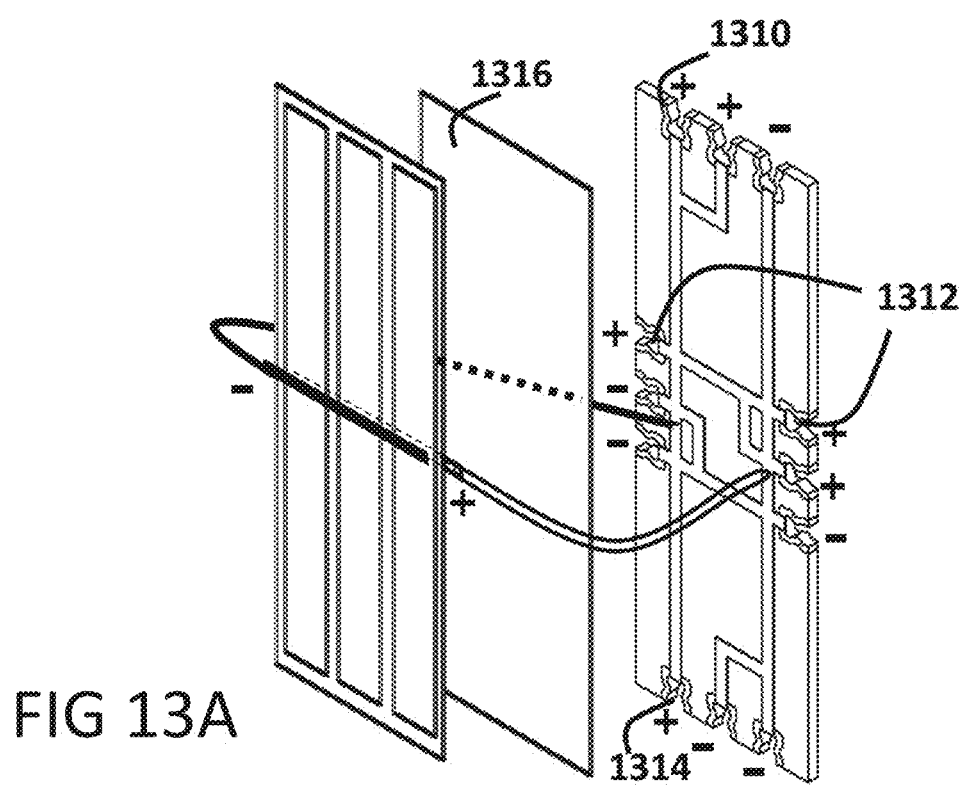
FIGS. 13A-13B show an embodiment of the photovoltaic appliance with appliance electrical connectors placed on top and bottom of the appliance as well as the two lateral sides.
Figure 13B:
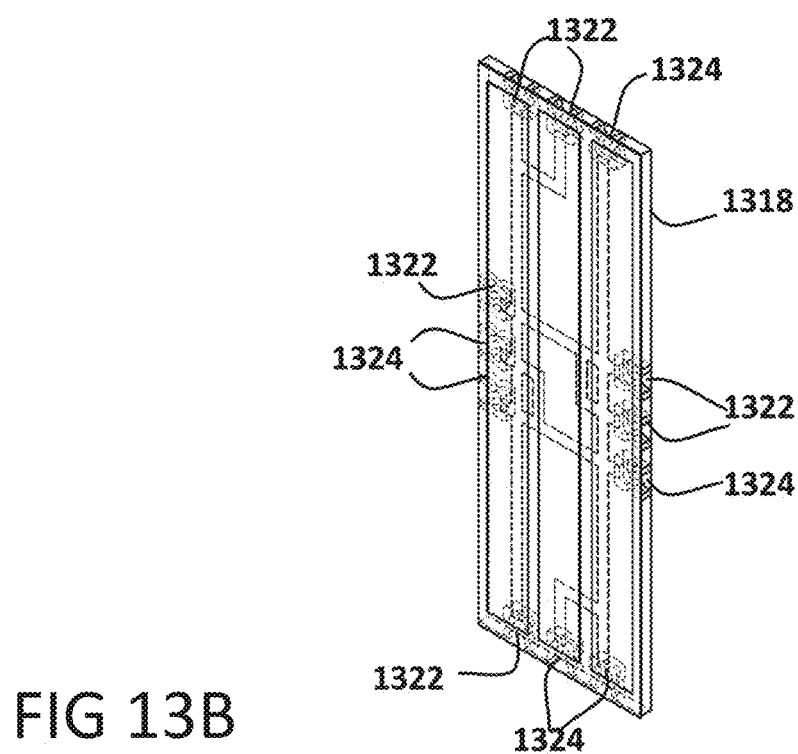

Instead of the layered design of FIG. 12, as shown by FIG. 13A, a wireboard design may also be used to place connectors on each side of a PV appliance. As with FIG. 12, connectors may be placed on each of the sides of the PV appliance including, for example, positive connectors 1312 on each of the left and right sides, as well as connectors on the top 1310 and bottom 1314. A corresponding set of negative connectors is also shown. The electrical connection to the solar cells is similar to FIG. 12, though performed on wire board. FIG. 13B shows the completed structure, with positive terminals 1322 and negative terminals 1324 on several sides of the PV appliance 1318.

Figure 13C:
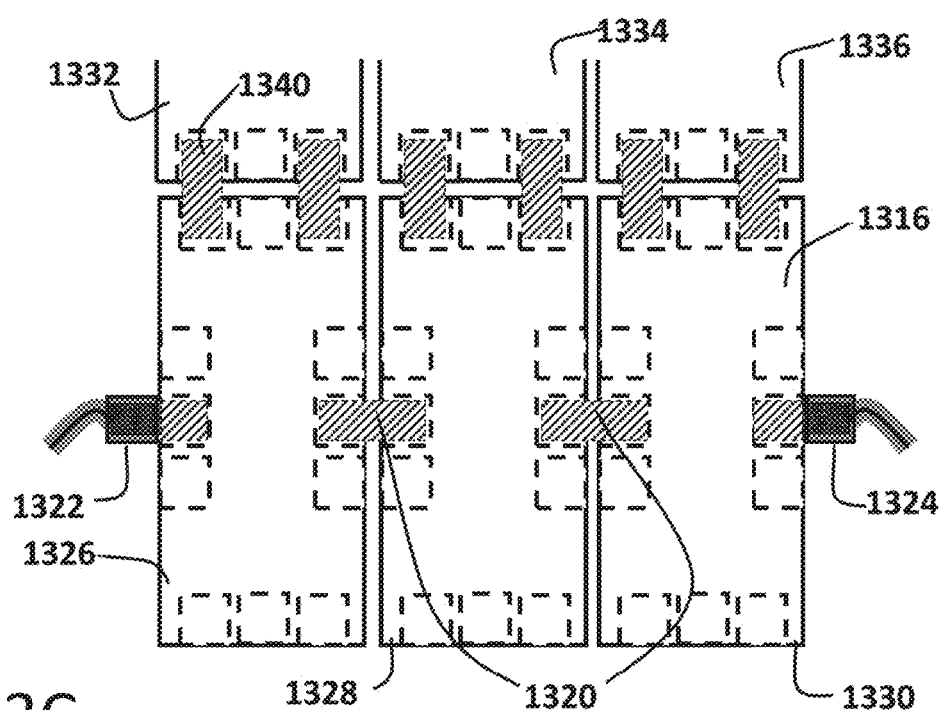
FIG. 13C shows six modular devices of the embodiment of FIGS. 13A-13B interconnected to illustrate electrical and spatial flexibility.

FIG. 13C shows the use of the four sided contacts to achieve a series/parallel configuration from a first appliance connector 1322 to a second appliance connector 1324, in which a total of six PV appliances are connected. First, three PV appliances 1326, 1328, and 1330 are connected in series using the central most of the connectors on the long edge of each, coupled together with male couplers 1320. In addition, PV appliance 1326 is connected in parallel with PV appliance 1332, using male couplers 1340. Likewise, PV appliance 1328 is connected in parallel with PV appliance 1334, and PV appliance 1330 is connected in parallel with PV appliance 1336. The output of this completed modular assembly would provide a voltage of 3V, and current of 2 I, if V and I represent the voltage and current of a single PV appliance. This outcome can be understood by noting that there are three stages in series: a first stage of PV appliances 1326, 1332 connected in parallel with voltage V and current 2 I, a second stage with PV appliances 1328, 1334 connected in parallel with voltage V and current 2 I, and a third stage with PV appliances 1330, 1336 connected in parallel with voltage V and current 2 I; thus, each stage contributes V, and has a current capacity of 2 I. Those skilled in the art will recognize that the series output voltage would then be 3V, with a series current of 2 I. Those skilled in the art will also recognize that as larger quantities of individual appliances are connected, intrinsic impedances may become important to determining actual performance, and the general, simple summing used in this explanation is merely a first order estimation.$_{[m3]}$ If desired, the PV appliances may include grooves, holes, slots and the like for providing structural integrity to an overall installation, facilitating, for example, the provision of an outer frame around an installation. If holes or slots are provided, screws or keys may be used to secure individual appliances together to provide more structural integrity than could be provided using just the electrical connectors and couplers. Straps, borders, and/or corner or edge connectors may be provided to secure the outer perimeter of an installation or to hold as internal corners of individual appliances together across an installation.

Figure 14:
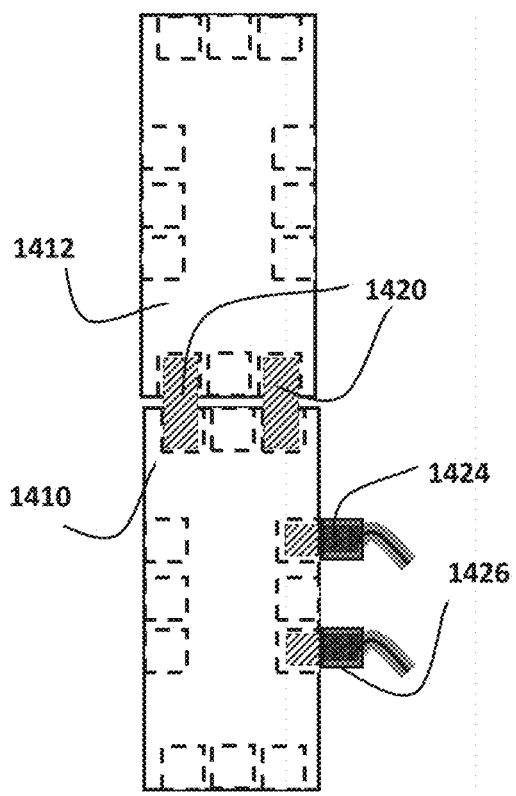
FIG. 14 shows interconnection of two modular devices of the embodiment of FIGS. 13A-13B in a series connection.

FIG. 14 shows another configuration, in which the input/output terminals may be selected to make wiring simple. Here, two PV appliances 1410, 1412 are connected in parallel using male connectors 1420. The output terminals 1424, 1426 are taken adjacent one another, potentially making for easier wiring. Further parallel connections can be made using the connector slots of either PV appliance 1410, 1412.

As will be understood by those skilled in the art, any shape of PV appliance may be used, including regular and irregular polygons such as triangles, squares, pentagons, etc. Connections may be placed on one or more sides, including all sides, as desired. Further, shipping and handling costs of larger PV installations can be managed more easily with the modular designs shown, since, for example, a 3 meter by 3 meter installation could be accomplished using a number of 30 cm by 30 cm modular, square, pieces (or larger or smaller pieces), so that rather than shipping a 3 meter by 3 meter box (plus space for connectors and protective padding/cushioning), a much more compact and less fragile container may be used.

Figure 15:
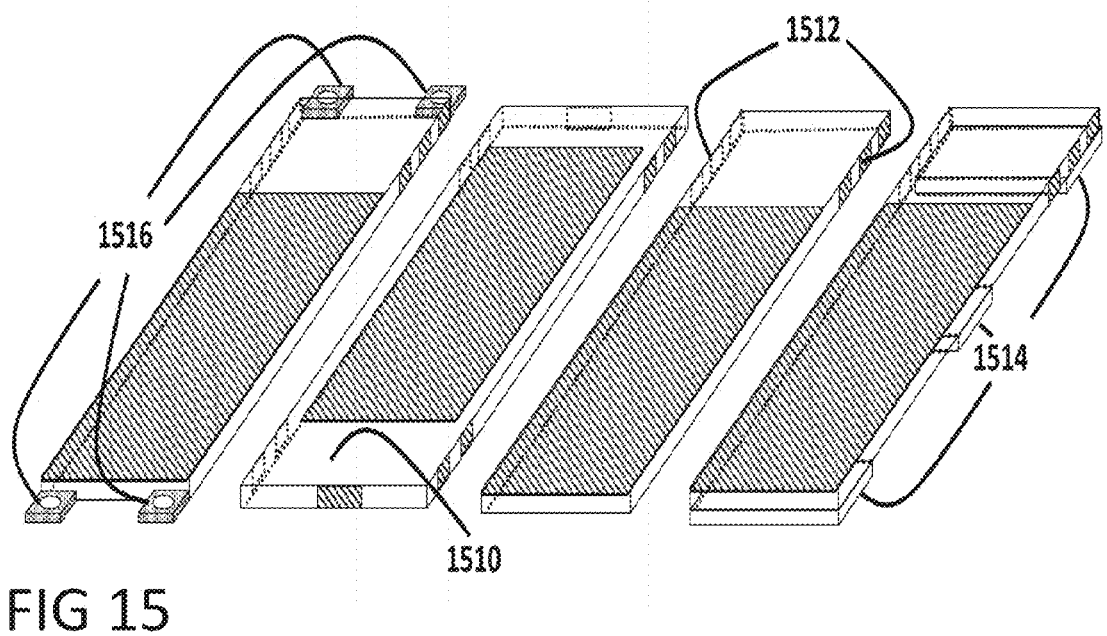
FIG. 15 presents alternate views of the photovoltaic appliance with different form factors, electrical connector placement location, and appendages to the body of the photovoltaic appliance.

As shown in the various embodiments of the photovoltaic appliance in FIG. 15, there could be modifications to the body of the photovoltaic appliance where the area of the body or the casing can be larger than the solar cell 1510, and the placement of the contacts can be arbitrary as shown in 1512. The number of connectors can also be larger where apart from supplying electrical power to a load, some of the connectors can provide data about the photovoltaic appliance, like internal temperature, and wattage, through a serial or I2C interface, for example. In some examples, the couplers may be hinged or pre-formed with an angle to allow 3-dimensional structures to be made.$_{[m4]}$ The body of the photovoltaic appliance can have form factors other than the box type profile. For example the base of the appliance can have grooves 1514 which could be solid or hollow, or may contain magnets to attach the photovoltaic appliance to ferromagnetic surfaces. The body can also have holes and other attachments 1516 that can help attach the photovoltaic appliance to one another or to a variety of surfaces.

Figure 16:
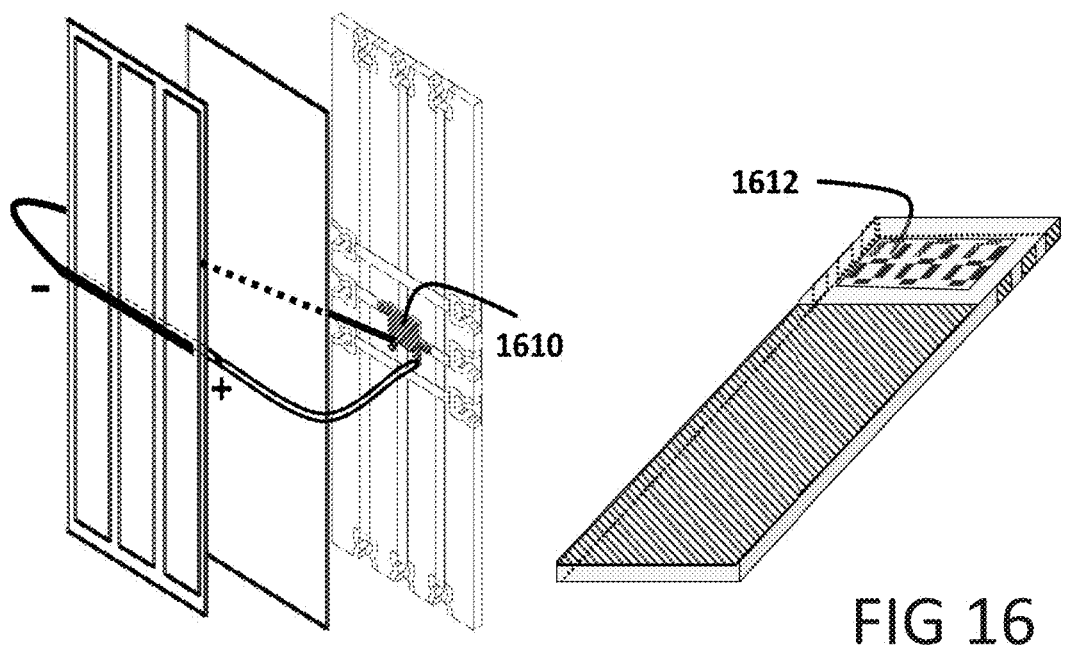
FIG. 16 shows one of the embodiments of a modular photovoltaic appliance including embedded electronic circuitry and a display device.

Some other embodiments of the photovoltaic appliance could contain electronic circuits embedded into the metal interconnect layer which can include active devices like semiconductor transistors and diodes or passive devices like capacitors, inductors or resistors and even batteries to control the electrical power transmitted through the electrical connectors. One simple configuration shown in FIG. 16 has a diode 1610 connected between the solar cell and the metal interconnect to prevent backward flow of electricity into the solar cell, by a wrongly connected photovoltaic appliance or array of backflow of electrical energy from the load connected to the photovoltaic appliance. Simple LEDs may be included to assist in identifying proper connection of multiple appliances. To facilitate assembly on a worksite, the PV appliances may include off switches or the like to isolate or ground electrical outputs during assembly. Such switches may also be useful in maintaining a PV appliance array by facilitating the shutting off of a malfunctioning PV appliance.$_{[m5]}$ The metal interconnect layer could also comprise circuits like sensors, wireless devices, LEDs or LCD displays 1612 that can show the state of the photovoltaic appliance to the users of the appliance.

Each of these non-limiting examples can stand on its own, or can be combined in various permutations or combinations with one or more of the other examples. The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein. In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." Moreover, in the following claims, the terms "first," "second," and "third," etc. are used merely as labels, and are not intended to impose numerical requirements on their objects. The above description is intended to be illustrative, and not restrictive. For example, the above-described examples (or one or more aspects thereof) may be used in combination with each other. Other embodiments can be used, such as by one of ordinary skill in the art upon reviewing the above description.

The Abstract is provided to comply with 37 C.F.R. §1.72(b), to allow the reader to quickly ascertain the nature of the technical disclosure. It is submitted with the understanding that it will not be used to interpret or limit the scope or meaning of the claims.

Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A modular solar cell assembly comprising:
   a solar cell structure for receiving solar energy and converting the solar energy into electricity, the solar cell structure including first and second outputs of respective first and second polarities;
   an insulating layer;
   an interconnect layer; and
   a backing layer;
   wherein the modular solar cell assembly has a perimeter including at least a first side comprising a plurality of connectors including at least first, second and third connectors, the first and second connectors coupled electrically by the interconnect layer to the first output of the solar cell structure, and the third connector coupled electrically by the interconnect layer to the second output of the solar cell structure;

wherein the plurality of connectors are configured for repeatable connection and disconnection to one or more adjacent modular solar cell assemblies of like design without soldering thereto.

2. The modular solar cell assembly of claim 1 wherein at least one of the plurality of connectors is a male connector having a protrusion extending beyond a border of the interconnect layer, and at least one of the plurality of connectors is a female connector configured to receive a male connector of an adjacent modular solar cell assembly of like design.

3. The modular solar cell assembly of claim 1 wherein the plurality of connectors are female connectors configured to receive and mechanically and electrically couple with a male coupler to facilitate connection to an adjacent modular solar cell assembly of like design.

4. A modular solar cell system comprising at least two modular solar cell assemblies as in claim 3 and one or more male couplers for connecting together the at least two modular solar cell assemblies, wherein the plurality of the connectors of the at least two modular solar cell assemblies are configured and placed to facilitate each of:
a parallel connection between the at least two modular solar cell assemblies using two of the male couplers; and
a series connection between the at least two modular solar cell assemblies using one of the male couplers.

5. A modular solar cell system comprising at least first, second, third and fourth modular solar cell assemblies as in claim 3 and a plurality of male couplers for coupling together the at least first, second, third and fourth modular solar assemblies as follows:
the first and second modular solar cell assemblies are coupled in parallel to one another in a first stage using two of the male couplers placed along a first side of the first modular solar cell assembly and a first side of the second modular solar cell assembly;
the third and fourth modular solar cell assemblies are coupled in parallel to one another in a second stage using two of the male couplers placed along a first side of the third modular solar cell assembly and a first side of the fourth modular solar cell assembly; and
the first stage and the second stage are connected together in series using one of the male couplers placed on a second side of the first modular solar cell assembly and on a second side of the third modular solar cell assembly;
such that outputs from the system can be taken from a third side of the first modular solar cell assembly and a third side of the third modular solar cell assembly.

6. A modular solar cell assembly as in claim 3 wherein the connectors are constructed of a flexible and elastic metal for facilitating repeatable connection over a detent, a ridge or dimple of the male coupler.

7. A modular solar cell assembly as in claim 1 wherein the solar cell structure is a photovoltaic solar cell.

8. A modular solar cell assembly as in claim 1 having an outer perimeter in the shape of a polygon having at least three connectors including at least one connector coupled to the first output of the solar cell structure and at least one connector coupled to the second output of the solar cell structure on each of at least two sides thereof.

9. A modular solar cell assembly as in claim 1 having an outer perimeter in the shape of a polygon having at least three connectors including at least one connector coupled to the first output of the solar cell structure and at least one connector coupled to the second output of the solar cell structure on each of at least three sides thereof.

10. A modular solar cell assembly as in claim 9 wherein the polygon is a square or a rectangle.

11. A modular solar cell assembly as in claim 1 further comprising at least one circuit element disposed in connection to the interconnect layer including one of an LED display, a diode, a resistor and a switch.

12. A modular solar cell assembly as in claim 1 further comprising an encapsulating layer covering at least the solar cell structure and weatherproofing at least a portion of the plurality of connectors.

13. The modular solar cell assembly of claim 1, wherein the perimeter comprises a second side including at least fourth, fifth and sixth connectors, the fourth connector being coupled electrically by the interconnect layer to the first output of the solar cell structure, and the fifth and sixth connectors being coupled electrically by the interconnect layer to the second output of the solar cell structure.

14. A modular solar cell assembly comprising:
a solar cell structure for receiving solar energy and converting the solar energy into electricity and having first and second outputs of first and second polarities;
an insulating layer;
an interconnect layer; and
a backing layer;
wherein the modular solar cell assembly has a perimeter including at least a first side comprising a plurality of connectors including at least first, second and third connectors, the first and second connectors coupled electrically by the interconnect layer to the first output of the solar cell structure, and the third connector coupled electrically by the interconnect layer to the second output of the solar cell structure;
wherein the plurality of connectors facilitate selective coupling of the modular solar cell assembly in parallel or series with one or more other modular solar cell assemblies using first and second male couplers configured for insertion into the plurality of connectors.

15. The modular solar cell assembly of claim 14 wherein the modular solar cell assembly is rectangular and the perimeter includes three connectors on two opposing sides thereof.

16. The modular solar cell assembly of claim 14, wherein the perimeter comprises a second side including at least fourth, fifth and sixth connectors, the fourth connector being coupled electrically by the interconnect layer to the first output of the solar cell structure, and the fifth and sixth connectors being coupled electrically by the interconnect layer to the second output of the solar cell structure.

17. A method of constructing a solar cell array comprising connecting together at least two modular solar cell assemblies, wherein each of the at least two modular solar cell assemblies comprise:
a solar cell structure for receiving solar energy and converting the solar energy into electricity and having first and second outputs of first and second polarities;
an insulating layer;
an interconnect layer; and
a backing layer;
wherein each of the first and second modular solar cell assemblies has a perimeter including at least a first side comprising a plurality of connectors including at least first, second and third connectors, the first and second connectors coupled electrically by the interconnect layer to the first output of the solar cell structure, and the third connector coupled electrically by the interconnect layer to the second output of the solar cell structure;

wherein the plurality of connectors facilitate selective coupling of the modular solar cell assembly in parallel or series with one or more other modular solar cell assemblies using first and second male couplers configured for insertion into the plurality of connectors.

18. The method as in claim 17 wherein the first of the at least two modular solar cell assemblies has a second side with fourth, fifth and sixth connectors, the fourth connector being coupled electrically by the interconnect layer to the first output of the solar cell structure, and the fifth and sixth connectors being coupled electrically by the interconnect layer to the second output of the solar cell structure, and the step of connecting together the first and second modular solar cell assemblies is performed by using a first male coupler to couple together the fifth connector of the first modular solar cell assembly and the second connector of the second modular solar cell assembly, achieving an electrical connection of the first and second modular solar cell assemblies in series with one another.

19. The method of claim 17 wherein the step of connecting together the first and second modular solar cell assemblies is performed by using a first male coupler to couple the first connector of the first modular solar cell assembly to the first connector of the second modular solar cell assembly, and a second male coupler to couple the third connector of the first modular solar cell assembly to the third connector of the second modular solar cell assembly, achieving an electrical connection of the first and second modular solar cell assemblies in parallel with one another.

20. The method of claim 17 wherein the step of connecting is performed without applying adhesive or soldering.

* * * * *